(12) United States Patent
Laslo et al.

(10) Patent No.: US 12,744,078 B2
(45) Date of Patent: Sep. 22, 2026

(54) WRITEBACK CONTROL FOR READ-DESTRUCTIVE COMPUTER MEMORY

(71) Applicant: Microsoft Technology Licensing, LLC, Redmond, WA (US)

(72) Inventors: Ori Laslo, Rehovot (IL); Gilad Kirshenboim, Petach Tiqva (IL)

(73) Assignee: Microsoft Technology Licensing, LLC, Redmond, WA (US)

( * ) Notice: Subject to any disclaimer, the term of this patent is extended or adjusted under 35 U.S.C. 154(b) by 124 days.

(21) Appl. No.: 18/715,953

(22) PCT Filed: Oct. 25, 2022

(86) PCT No.: PCT/US2022/078646

§ 371 (c)(1),
(2) Date: Jun. 3, 2024

(87) PCT Pub. No.: WO2023/107784

PCT Pub. Date: Jun. 15, 2023

(65) Prior Publication Data

US 2025/0046361 A1 Feb. 6, 2025

(30) Foreign Application Priority Data

Dec. 8, 2021 (NL) .................................... 2030081

(51) Int. Cl.
*G11C 11/54* (2006.01)
*G11C 11/408* (2006.01)
*G11C 11/4096* (2006.01)

(52) U.S. Cl.
CPC ........ *G11C 11/4096* (2013.01); *G11C 11/408* (2013.01); *G11C 11/54* (2013.01)

(58) Field of Classification Search
CPC ..................................................... G11C 11/54
See application file for complete search history.

(56) References Cited

U.S. PATENT DOCUMENTS 6,178,479 B1 1/2001 Vishin
7,234,028 B2 6/2007 Edirisooriya
(Continued)

FOREIGN PATENT DOCUMENTS

CN 103019624 B 7/2015
CN 108647782 A 10/2018
WO 03023578 A2 3/2003

OTHER PUBLICATIONS

International Search Report and Written Opinion Issued in PCT Application No. PCT/US22/078646, Mailed Date: Jan. 23, 2023, 13 Pages.

(Continued)

*Primary Examiner* — Hoai V Ho
(74) *Attorney, Agent, or Firm* — Alleman Hall LLP

(57) ABSTRACT

A method comprises receiving a read instruction and determining a read address in computer memory corresponding to the read instruction, where the read address references a cell within a row of read-destructive computer memory. The method further comprises determining a discard state for data stored in the row according to a usage of the data, the discard state being positive for data to be read only once and negative for data to be read more than once. The data is read from the row and written back to the row if the discard state is negative. If the discard state is positive, then the method returns without writing the data back to the row.

18 Claims, 5 Drawing Sheets

(56) References Cited

U.S. PATENT DOCUMENTS

| | | | | |
|---|---|---|---|---|
| 8,427,466 | B2 | 4/2013 | Huang | |
| 8,621,324 | B2 | 12/2013 | Suh | |
| 8,959,280 | B2 | 2/2015 | Yu | |
| 10,726,904 | B2 | 7/2020 | Suh | |
| 2007/0130425 | A1* | 6/2007 | Ueda | G11C 11/22 711/115 |
| 2020/0098420 | A1 | 3/2020 | Li et al. | |
| 2020/0160157 | A1* | 5/2020 | Kim | G06N 3/063 |

OTHER PUBLICATIONS

Lee, et al., “Skinflint DRAM System: Minimizing DRAM Chip Writes for Low Power”, 19th International Symposium on High Performance Computer Architecture (HPCA), Feb. 2013, 10 pages.

Search Report Issued in Netherlands Patent Application No. N2030081, Mailed Date: Jul. 12, 2022, 13 Pages.

Tu, et al., “RANA: Towards Efficient Neural Acceleration with Refresh-Optimized Embedded DRAM”, In Proceedings of ACM/IEEE 45th Annual International Symposium on Computer Architecture, 2018, pp. 340-352.

Examination report Received for Indian Application No. 202417041833, mailed on Mar. 11, 2026, 11 pages.

* cited by examiner

WRITEBACK CONTROL FOR READ-DESTRUCTIVE COMPUTER MEMORY

CROSS REFERENCE TO RELATED APPLICATIONS

The present application is a U.S. National Phase of International Patent Application Serial No. PCT/US2022/078646 entitled "WRITEBACK CONTROL FOR READ-DESTRUCTIVE COMPUTER MEMORY", filed Oct. 25, 2022, which claims priority to Netherlands Patent Application Serial No. 2030081, filed Dec. 8, 2021, the entire contents of each of which are hereby incorporated by reference for all purposes.

BACKGROUND

A computer system may include different forms of computer memory, each optimized for a particular data storage or retrieval task. Read-write computer memory is characterized as 'read-destructive' if the integrity of the stored data is reduced upon reading the data. In order to preserve data read from a read-destructive computer memory, so that the same data can be read again, such data may be written back to the memory after the read operation is enacted. One example of read-destructive computer memory operated in this manner is dynamic random-access memory (DRAM). Relative to other forms of computer memory, DRAM offers low cost and high storage density, making it an attractive technology for 'system' or 'core' memory of a modern computer system.

SUMMARY

One aspect of this disclosure relates to a method enacted in memory-control logic coupled operatively to read-destructive computer memory. The method comprises receiving a read instruction and determining a read address in the computer memory corresponding to the read instruction, where the read address references a cell within a row of the computer memory. The method further comprises determining a discard state for data stored in the row according to a usage of the data, the discard state being positive for data to be read only once and negative for data to be read more than once. In this method the data is read from the row and written back to the row if the discard state is negative. If the discard state is positive, then the method returns without writing the data back to the row.

Another aspect of this disclosure relates to memory-control logic coupled operatively to read-destructive computer memory. The memory-control logic comprises an instruction decoder, writeback logic, a row reader, and a row writer. The instruction decoder is configured to receive a read instruction and to determine a read address in the computer memory corresponding to the read instruction, where the read address references a cell within a row of the computer memory. The writeback logic is configured to determine a discard state for data stored in the row according to a usage of the data, the discard state being positive for data to be read only once and negative for data to be read more than once. The row reader is configured to read the data from the row; the row writer is configured to write the data back to the row if the discard state is negative, and to return without writing the data back to the row if the discard state is positive.

This Summary is provided to introduce in simplified form a selection of concepts that are further described in the Detailed Description. This Summary is not intended to identify key features or essential features of the claimed subject matter, nor is it intended to be used to limit the scope of the claimed subject matter. The claimed subject matter is not limited to implementations that solve any or all disadvantages noted in any part of this disclosure.

DETAILED DESCRIPTION

As noted above, DRAM is a form of read-destructive computer memory. Each cell of a DRAM array includes a capacitor (or capacitive terminal of field-effect transistor), which stores data in the form of electric charge. For instance, negative charge stored on the capacitor may correspond to a logical 1, and positive charge may correspond to a logical 0. The electric charge may be stable over a relatively long timescale (e.g., milliseconds) provided that no attempt is made to read the data. When the data is read, however, electric charge is drawn from the capacitor, thereby reducing the integrity of the data stored in the cell. Accordingly, a DRAM may be operated in a 'writeback' mode, where, at the conclusion of the read operation, full negative recharge is provided to the capacitor of each cell read as logical 1 and full positive recharge provided to the capacitor of each cell read as logical 0.

The disadvantage of conventional writeback is that recharge of every read cell consumes energy. If the read data is to be used once and never again, then the energy used to write it back to the memory is wasted energy. This issue is amplified in state-of-the-art configurations, where an entire row of DRAM (comprising thousands of cells and associated capacitors) is read and written back concurrently whenever any data within that row is requested. Unnecessary power dissipation increases the power and cooling requirements for computer systems generally and reduces the battery life of portable devices.

This disclosure provides a series of solutions that address the above issue. In methods and configurations herein, writeback is not enacted indiscriminately after every read operation, but judiciously, based on whether it is necessary to preserve the read data for future reading. The host computer system can make that determination and control writeback in various ways, which are explored hereinafter. By employing the disclosed methods and configurations, a computer system may reduce the frequency of unnecessary writeback, thereby reducing power dissipation in the computer memory. While the methods and configurations herein are applicable to many different computer systems and applications, they are particularly valuable for training and operation of neural networks. In a neural network spanning a large amount of read-destructive memory, it may be possible to distinguish, at compile time, data structures destined to be read once from those that must be preserved for repeated reading.

Figure 1:
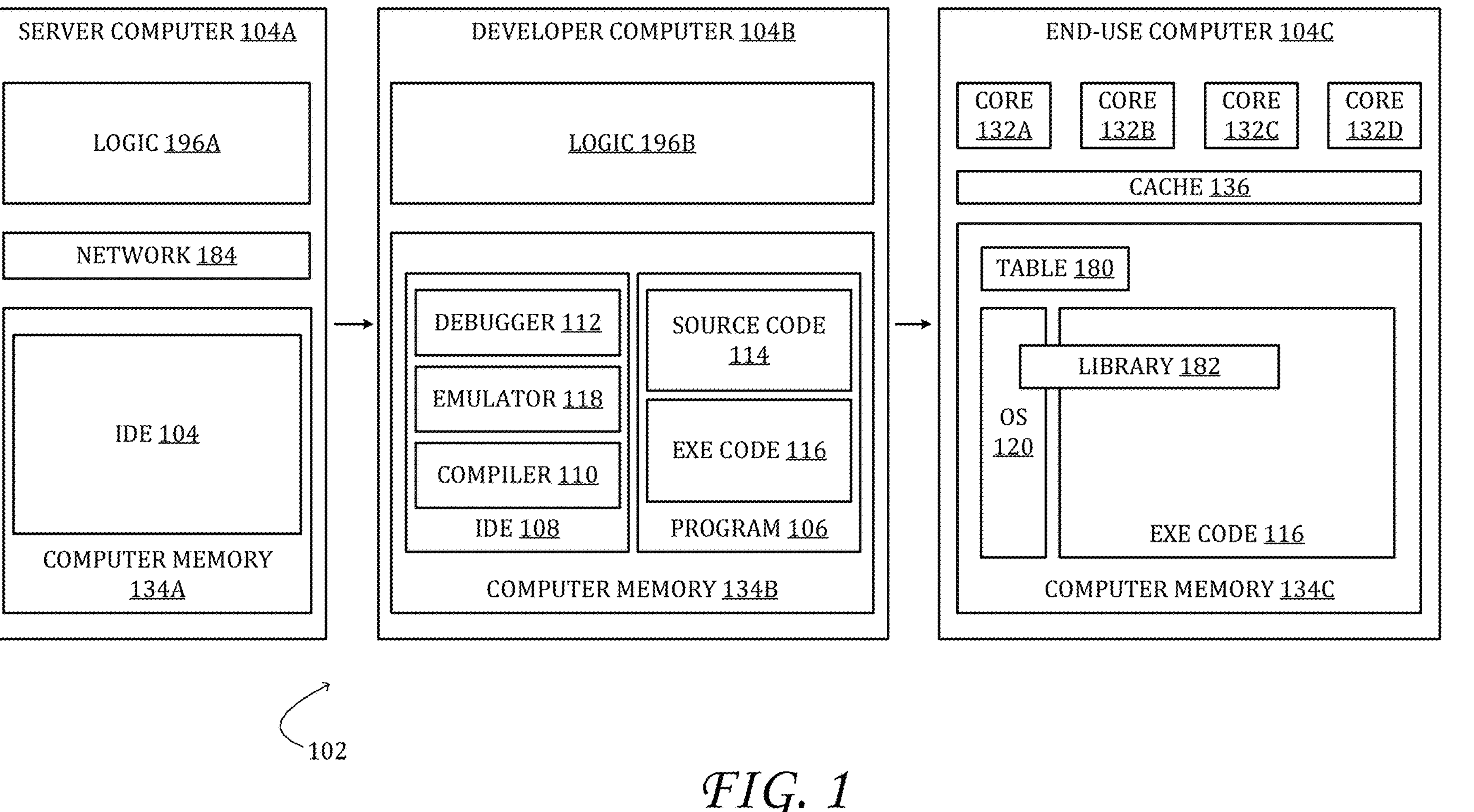
FIG. 1 shows aspects of an example computer system.

Turning now to the drawings, FIG. 1 shows aspects of an example computer system 102. The computer system as illustrated includes developer computer 104B and end-use computer 104C. In some examples, the developer computer may take the form of a desktop computer or server-computer. Developer computer 104B is configured to support development of a computer program 106 to be executed on end-use computer 104C. To that end, the developer computer includes integrated development-environment (IDE) software 108 including a compiler 110 and a debugger 112. The IDE software may also include a text editor and various local and/or network-accessible libraries (not shown in the drawings). Compiler 110 receives source code 114 composed by one or more developers and generates corresponding executable code 116, which executes on end-use computer 104C or on developer computer 104B. In some examples, the executable code may execute on the developer computer via emulator 118. An emulator is useful in scenarios where computer program 106 is developed for execution on an end-use computer that differs substantially from developer computer 104B. For instance, if developer computer 104B is a personal computer or server computer used to develop a program for execution on a game system or mobile device, then emulator 118 may be configured to emulate the game system or mobile device on the developer computer. In examples in which end-use computer 104C is directly connected to developer computer 104B, the emulator may be omitted.

End-use computer 104C may take the form of a desktop, laptop, tablet, handheld or wearable computer in some examples. In other examples, the end-use computer may take the form of a smartphone, game system, or server computer. More generally, the end-use computer may be virtually any computerized device. Hardware and various system-level procedures in end-use computer 104C are accessed by executable code 116 via operating system (OS) 120. In some examples, the features of end-use computer 104C shown in FIG. 1 may correspond to just one of a plurality of computational units of the end-use computer. In one, non-limiting example, the features shown may correspond to a neural processing unit (NPU)—a computational unit reserved for training and operation of a neural network.

End-use computer 104C may be one of a plurality of end-use computers onto which executable code 116 of computer program 106 is distributed. The executable code, or any equivalent thereof, may be provided on non-volatile data storage media, such as a flash drive or optical disc, or distributed via a network. The nature of computer program 106 is not particularly limited. Computer program 106 may be a system program or an application program. Example system programs include operating systems and extensions, hardware drivers, and class libraries. Example application programs include web browsers, productivity programs such as word processors, spreadsheets, email applications, SMS and navigation clients, and video games. Other application programs include compilers and command interpreters—e.g., virtual machines configured to execute uncompiled code or 'script' on the end-use computer. In some examples, computer program 106 may include a compiler feature configured to optimize code for execution on the specific hardware of the end-use computer. The end-use computer may execute device-agnostic code compatible with differently configured end-use computers, and the compiler feature may be relied upon to determine whether the end-use computer supports read-and-forget operation and to generate machine code accordingly. Thus, computer program 106 may be configured to support the methods herein—e.g., by coordinating the read-and-forget operations described hereinafter.

In one non-limiting example, computer program 106 may be configured to train and operate a neural network. Neural networks are used in a variety of technologic applications, including digital image processing. For instance, a trained classification machine based on a neural network may be used to recognize the face of a particular person in images acquired under varying conditions.

Figure 2:
FIG. 2 shows aspects of an example classification machine based on a convolutional neural network.
Figure 2:
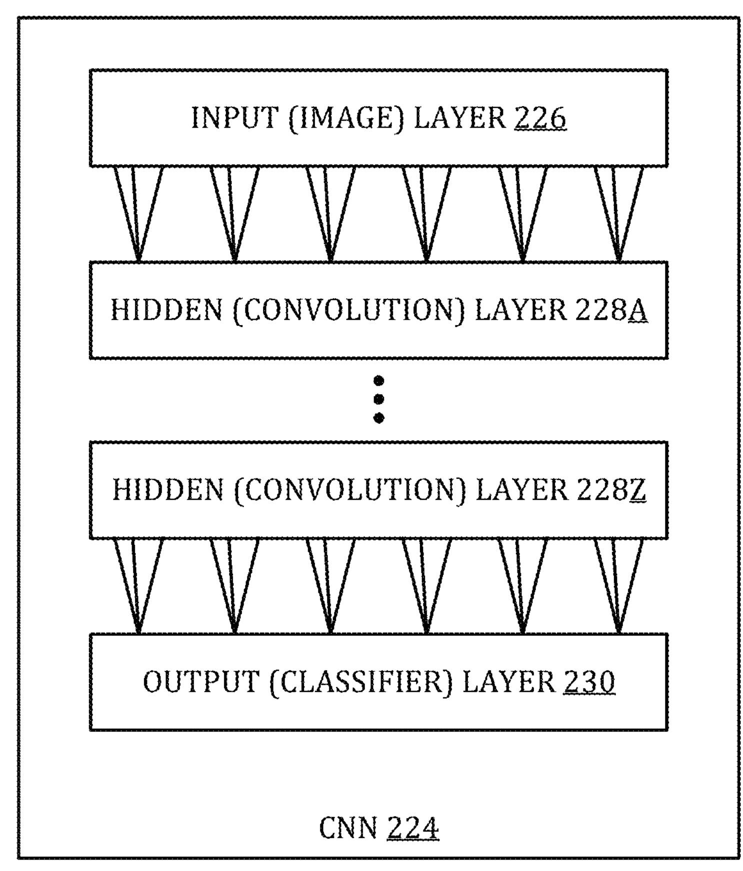

FIG. 2 shows aspects of an example classification machine 222 configured for image processing. Classification machine 222 is based on a fully convolutional neural network (CNN) 224 having an input layer 226, a series of hidden layers 228, and an output layer 230. Each layer of the CNN includes an array of logic constructs called 'neurons'. Each neuron i of the input layer may correspond to coordinates $(X,Y)_i$ of a digital image provided as input. During operation of the classification machine, each signal value $S_i$ of a digital image is received at the node corresponding to coordinates $(X,Y)_i$ of input layer 226 and is transformed successively through each of the series of hidden layers 228. Each neuron of a hidden layer receives its input from neurons of the layer above, enacts a logic operation on the input, and passes an output to neurons of the layer below. Each neuron of output layer 230 provides a classification label $C_i$ that is attached to coordinates $(X,Y)_i$. In some examples, the input layer of the network may be configured to receive one digital image at a time, both in training and in application. In other examples, the input layer may receive related sets of digital images.

In contrast to the neurons of a generic neural network, each neuron of CNN 200 receives input only from the neuron directly above it, or from a close neighbor of that neuron. This feature reflects the fact that any classification on coordinates $(X,Y)_i$ of a digital image depends more strongly on information close to $(X,Y)_i$ than on information from distant parts of the digital image.

Among the hidden layers 228 of CNN 200 are one or more convolution, or filter, layers. Each convolution layer enacts a filtering operation by computing a dot product between its vector of inputs and a filter vector of the same dimensions. The elements of each filter vector are adjustable parameters called 'filter weights'. During training of the CNN, the filter weights are optimized in a closed-loop manner, so as to cause the CNN to converge onto known, ground-truth classifications from a set of training images provided as input. More specifically, a global error is computed for classification of the contributing training images based on a trial set of filter weights, by comparing the output versus the ground-truth classifications. Then each filter weight is adjusted so as to reduce the global error in a process known as back propagation. To facilitate back propagation, the filtering and/or other logic function enacted by each neuron may be required to be differentiable with respect to an associated filter weight. In some examples, each neuron may include logic configured to compute its own derivatives. Such derivatives may be used in a parameter optimization procedure, such as the 'steepest descent' method, among others.

CNN 200 may include a large number of filters arranged in hidden layers 228. In contrast to a generic neural network, where the filter vectors of each neuron are optimized independently, the filter vectors in CNN 200 may be constrained to reflect the inherent similarities among the individual sensor elements of a sensor array. Provided that a sufficient quantity of labeled training data is made available during the training phase, a CNN can potentially learn to cope with non-idealities in image data. Moreover, CNNs are naturally invariant to translational shifting in the component images at the input layer, providing tolerance to variances and offsets among the various component images (training and operational).

Returning now to FIG. 1, end-use computer 104C is a multi-core system having four substantially independent processor cores 132A through 132D. Each of the processor cores of the end-use computer is operatively coupled to computer memory 134C, either directly or via memory cache 136. In general, the end-use computer may include any number of processor cores. Naturally, any physical configuration indicated for end-use computer 104C may be represented functionally by emulator 118 of developer computer 104B.

Computer memory 134C may include read-only memory in addition to read-write memory. The read-write memory may include relatively high-latency magnetic and/or optical memory in addition to relatively low-latency semiconductor memory. Moreover, different types of semiconductor memory may be used concurrently, such types differing in latency and other properties. For instance, the semiconductor memory of computer memory 134C may include a relatively large amount of random-access memory (RAM) in the form of dynamic RAM (DRAM) in addition to a smaller amount in the form of static RAM (SRAM). The DRAM may embody any DRAM technology-asynchronous DRAM, page-mode DRAM, burst DRAM, synchronous DRAM (SDRAM), dedicated graphics DRAM, and pseudostatic DRAM, for example. As noted herein above, the DRAM is read-destructive. Certain types of magnetic (and potentially, optical) memory may also be read-destructive. The methods herein apply to all forms of read-destructive memory.

Figure 3:
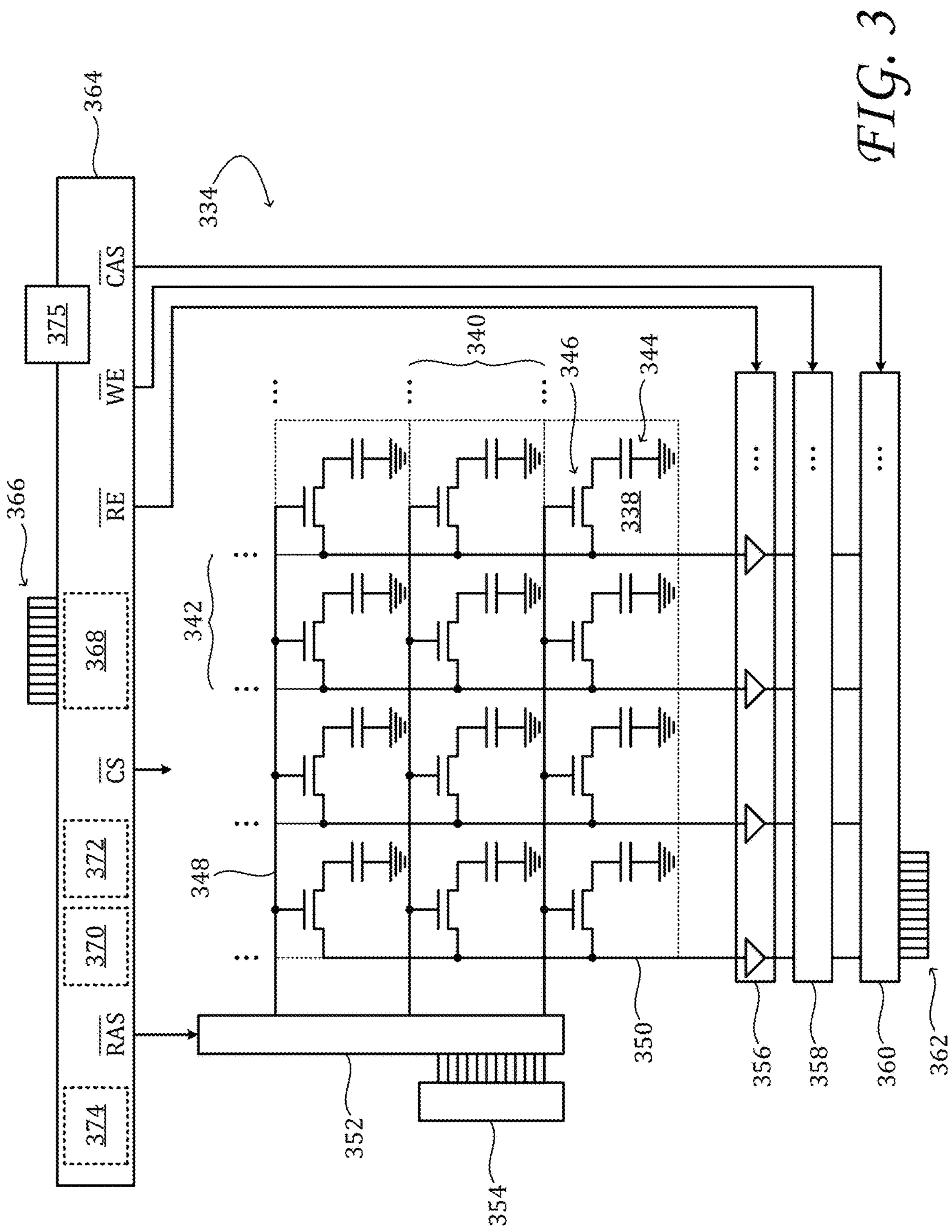
FIG. 3 shows aspects of an example computer memory.

FIG. 3 provides a schematic view of an example computer memory 334 including an array of DRAM cells 338. The cells are organized into a series of N rows 340, each row having M columns 342. In practical examples, both M and N may number in the thousands. In the illustrated example, each cell includes a capacitor 344 and at least one field-effect transistor 346 to control external electronic coupling to the capacitor. Each row 300 has a word line 348 connecting the gates of the transistors of that row. Each column 342 has at least one bit line 350 connecting the drains of the transistors of that column. Row decoder 352 comprises a demultiplexer that connects to each of the word lines, selecting the appropriate row based on the content of row register 354. Sense amplifier 356 includes a row of amplifiers connected each to a bit line and providing a stable row output to latch 358—a register configured to hold the data for the selected row. Data decoder 360 is a multiplexer that routes the appropriate cell of the latch to data bus 362 of the computer system.

In the illustrated example, data storage and retrieval operations in computer memory 334 are controlled by memory-control logic 364 via a series of strobe lines. Example strobe lines include row-access strobe $\overline{RAS}$, column-access strobe $\overline{CAS}$, write enable $\overline{WE}$, output enable $\overline{OE}$, and chip select $\overline{CS}$. Pursuant to read and write instructions received via instruction bus 366, the memory-control logic asserts one or more of the strobe lines according to a predefined timing. The instructions are processed in the various modules of the memory-control logic, which include instruction decoder 368, row reader 370, row writer 372, and writeback logic 374. In some examples, the memory-control logic may include additional modules, or fewer. Memory-control logic 364 may be configured for various operations based on the stored content of register file 375. In some examples, the memory-controller logic may be configured for a 'burst size' corresponding to an entire row of DRAM, to support the methods herein.

Figure 4:
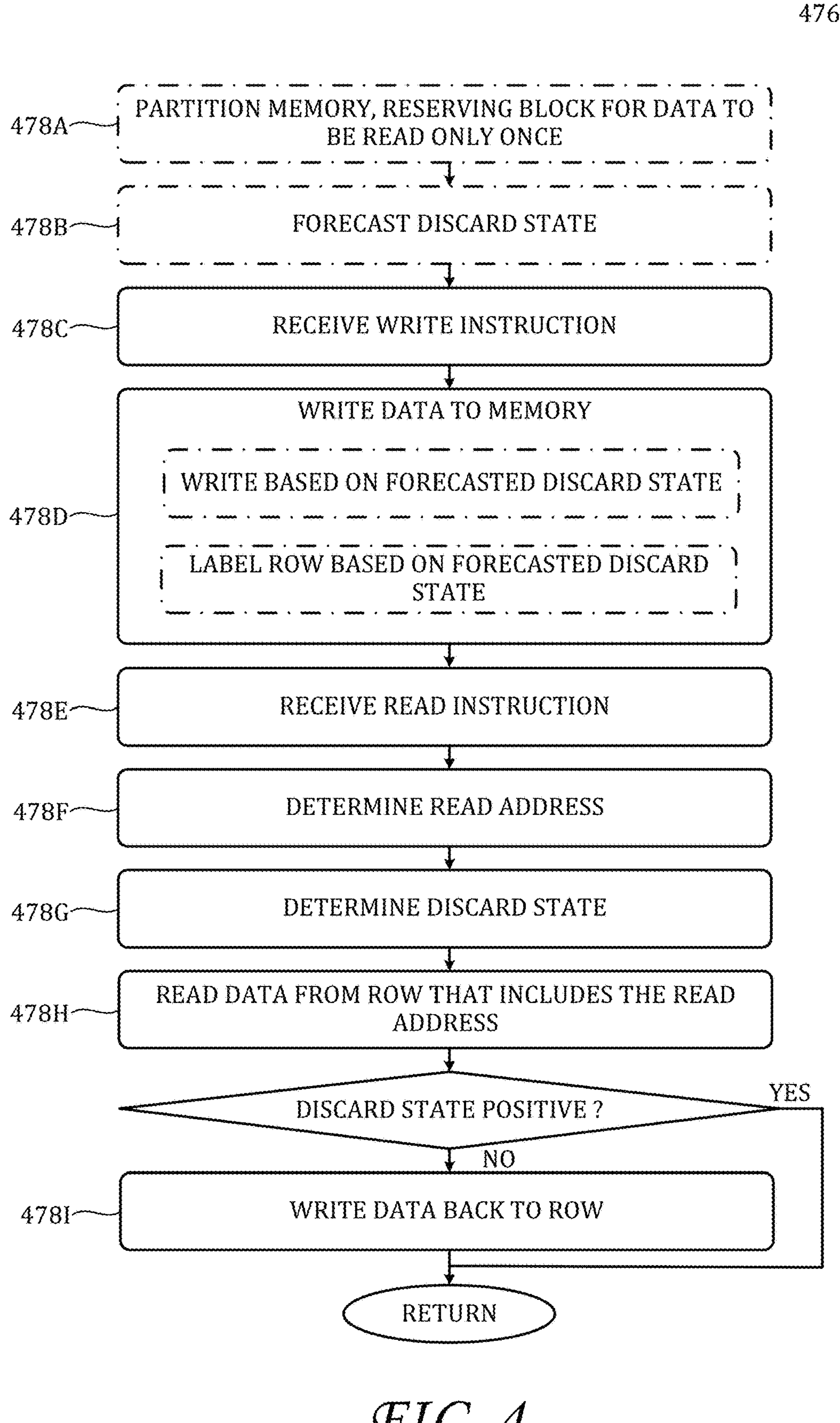
FIG. 4 shows aspects of an example method to read stored data from a read-destructive computer memory.

FIG. 4 shows aspects of an example method 476 to read stored data from read-destructive computer memory, such as DRAM. Method 476 also shows optional aspects of preparing the data for reading—e.g., partitioning the memory and writing the data to be read. For ease of illustration the read operations will be described first. Method 476 is enacted in a memory-control logic coupled operatively to the computer memory. For ease of illustration, the method is described with reference to the configurations described hereinabove—viz., memory-control logic 364, instruction decoder 368, row reader 370, row writer 372, writeback logic 374, and OS 120. In other examples, method 476 may be enacted on differently configured computer systems.

At 478E of method 476, the instruction decoder of the memory-control logic receives a read instruction. The read instruction may be parsed from compiled program code or dispatched by a command interpreter executing on the computer system. The read instruction may comprise machine code and may take the form of an opcode followed, in some examples, by one or more operands.

At 478F the instruction decoder determines at least a portion of the read address in the computer memory corresponding to the read instruction. The read address is the memory address of the data to be read in the current read operation; it references a cell within a row of the computer memory. The cell may be the high or low bit of the data structure—e.g., a byte, word, integer, float, etc—that contains the data.

In some examples, the read instruction received at 478E includes an offset to the read address—e.g., the read instruction may take the form [X, Y], where X is an opcode corresponding to a read operation, and Y is the offset. In examples in which the offset is relative to a predefined block in the computer memory, the instruction decoder may fully determine the read address based at least in part on the read instruction. In other examples, the offset Y may be relative to an unspecified block in the computer memory. There, the full determination of the read address, begun at 478F based on the read instruction, is completed at 478G with reference to the discard state governing the read operation (vide infra). In still other examples, the read instruction may not include an offset; the instruction decoder may determine the read address automatically. That variant may be used when reading data from a stack or from a sequential (e.g., memory-mapped) file that manages its own pointer. The several variants of determining the read address support the benefit of interoperability in (a) implementations where certain blocks of computer memory are reserved for data to be read only once as well as (b) implementations in which data to be read only once and data to be read more than once are stored in the same block of computer memory. It will be noted that the terms 'based on' and 'based in part on' are used interchangeably in this disclosure—e.g., A is determined based on B; this construction neither requires nor precludes any implementation in which A is determined based partly on B and further based on another condition besides B.

As noted above, the read address determined at 478F references a cell within a row of the computer memory. At 478G writeback logic of the memory-control logic determines a 'discard state' for data stored in the row according to a usage of the data. By definition, the discard state is positive for data to be read only once and negative for data to be read more than once. In more particular implementations, the discard state is positive if the usage of the data allows the data to be forgotten after reading and negative if the usage of the data requires the data to be read more than once. The discard state may take the form of digital data or signal—e.g., a bit flag stored in a register or in a variable having any appropriate scope.

In some examples, the discard state is determined based at least in part on the read instruction received at 478E. For instance, the read instruction may include a different opcode X depending on whether the data is to be read only once or whether it is to be read more than once. As a purely illustrative example, opcode X=0129 may specify a 'read-and-forget' operation, appropriate for data that is to be read only once. This opcode, when received in the instruction decoder, may set the discard state of the row to positive. Conversely, opcode X=012A may specify a 'read-and-write-back' operation, appropriate for data that is to be read more than once. This opcode, when received in the instruction decoder, may set the discard state to negative.

In some examples, the discard state may be determined based on the read address—with or without additional input. For instance, certain blocks in the computer memory may be reserved for data to be read only once (vide infra). The mere fact that the data is stored in such a block may indicate that the discard state, for reading such data, should be positive. Conversely, the mere fact that the data is stored outside of a reserved block may indicate that the discard state, when reading such data, should be negative. Accordingly, in examples using reserved memory blocks, the writeback logic may determine the discard state based at least in part on the read address. To illustrate concretely, in one example the block beginning 0x1000 is reserved for data to be read only once, but the block beginning 0x2000 is not reserved. Thus, if the read address is determined to be 0x1F34 then the discard state is positive; if the read address is determined to be 0x2F34 then the discard state is negative.

The converse of the above logic is also envisaged. As noted above, the actions taken at 478F of method 476 may, in some examples, furnish an offset to the read address relative to an unspecified block in the computer memory. In such examples, where certain memory blocks are reserved for data to be read only once, the address of the unspecified block may be determined based at least in part on the discard state, thereby enabling determination of the full read address. Recall, in the example above, that the block beginning 0x1000 was reserved for data to be read only once, but the block beginning 0x2000 was not reserved. If the relative offset Y is equal to F34, then the complete read address would be 0x1F34 if the discard state is positive and 0x2F34 if the discard state is negative. In some examples, as noted above, the discard state may be determined based on an opcode that specifies either read-and-forget or read-and-writeback. Thus, the read address corresponding to a given read operation may be determined based in part on the discard state. When this feature is implemented, the compiler or command interpreter can invoke a read-and-forget operation while remaining agnostic to the detailed partitioning of the computer memory.

In some examples, the computer memory need not be partitioned as described above. Instead, individual rows of the computer memory may be dynamically labeled in advance of the read operation to indicate that the data currently stored therein is to be read only once. Thus, the discard state may be determined based at least in part on a currently stored row label corresponding to the row that includes the read address. In some examples, row labels may be stored in a table accessible to the executing program, compiler, and/or command interpreter—e.g., table 180 of FIG. 1. In other examples, row labels may be stored in a dedicated bit register of the memory-control logic, which is indexed to the rows of the computer memory. In some implementations, the use of a dynamic row label instead of, or in addition to, partitioning the computer memory at the outset of code execution, provides a benefit of flexibility in memory management, while still securing the power-saving advantages of the methods disclosed herein.

In some examples the data to be read may correspond to a layer of a neural network, such as neural network 200 of FIG. 2. Here the discard state may be negative when the layer is an output layer (e.g., output layer 230) and positive when the layer is an input layer (e.g., input layer 226) or an intermediate layer (e.g., any hidden layer 228). The discard state may also be positive when the read data corresponds to an intermediate result (or 'partial sum') within any layer, and negative when the data corresponds to a weighting coefficient of the neural network. A particular practical benefit is realized in implementations in which the read-and-forget versus read-and-writeback determination can be made based on the nature of the read data, without any case-by-case determination required of the developer. Accordingly, the power-savings advantage of method 476 may be realized on any supported hardware platform, in a developer-agnostic manner.

At 478H the row reader reads data from the row of computer memory that includes—e.g., brackets—the read address. The reading is enacted by loading N' highest bits of the row address into the row register and asserting one or more strobe lines, which latch the data into the data register. At this point significant electric charge is drawn from the capacitors of the cells of the read row, thereby degrading the integrity of the data stored therein.

Additional features of method 476 differ depending on the discard state determined at 478G. In essence, a negative discard state invokes read-and-writeback operation, while a positive discard state invokes read-and-forget operation. In some examples, reading and writing the data include asserting one or more strobe lines of the memory-control logic. Thus, the two different read operations may be distinguished from each other based on the combination or timing of the strobe lines asserted, which depend on the discard state. For example, the writeback logic may assert strobe lines $\overline{RAS}$ and $\overline{OE}$ when the discard state is negative, thereby triggering read-and-writeback. When the discard state is positive the writeback logic may assert $\overline{RAS}$ and $\overline{OE}$ in combination with another strobe line, thereby triggering read-and-forget. In other examples, the two different read operations are distinguished based at least in part on the timing of assertion of one or more strobe lines. For example, the writeback logic may synchronously assert $\overline{RAS}$ and $\overline{OE}$ when the discard state is negative, thereby triggering a read-and-writeback operation. When the discard state is positive the writeback logic may assert $\overline{RAS}$ at the trailing edge of $\overline{OE}$, thereby triggering a read-and-forget operation. Naturally, numerous other combinational and sequential variants fall within the spirit and scope of this disclosure. The use of differential strobe-line timing to distinguish read-and-forget from read-and-writeback provides the advantage of securing the power-savings advantages herein with little or no change in the DRAM hardware.

At 478I the row writer writes the data back to the row if the discard state for the data stored in the row is negative. If the discard state for the data stored in the row is positive, then the writeback logic returns without writing the data back to the row.

Method 476 provides additional benefits in scenarios in which the data read from the memory is organized in a way that anticipates reading with judicious control of the write-back feature. One way to implement that approach—introduced above and illustrated at optional step 478A—is to partition the memory into two or more blocks, with at least one of the blocks reserved for data to be read only once.

Continuing in FIG. 4, at 478B of method 476 the operating system or any other code executing on the end-use computer (e.g., an application, compiler feature, command interpreter, etc.) may forecast the discard state of the data to be written to the write address pursuant to the write instruction. In some examples the discard state is forecast based on the procedure call P (Y,Z) from which the write instruction derives, where Y is an absolute or relative offset to the write address, and Z is data to be written at the write address. For instance, a different procedure call may be used depending on whether the written data will be read only once or read more than once. In other examples, the discard state is forecast based at least in part on the write address. For instance, if the write address is within a block reserved for data to be read only once, then a positive discard state is forecasted; otherwise a negative discard state is forecasted. As noted above in the context of the read operation, the converse of this logic is also envisaged—viz., when offset Y is relative to an unspecified block in the computer memory and the procedure call indicates that the data will be read only once, the offset can be made relative to the starting address of a reserved block. Thus the write address can be determined further based on the forecasted discard state. In examples in which the data is written to a sequential (e.g., memory-mapped) file or pushed onto a stack, the write address, by analogy to the read address discussed above, may be determined automatically.

In principle, data of any size down to a bit may be characterized as data to be read only once or as data to be read more than once. Because writeback in DRAM is performed on entire rows, however, the discard state may be treated as a row property. Accordingly, in examples in which the discard state is forecasted at the time of writing, that forecast must be updated as new data is written to an unfilled row. In effect, the discard state of a row must be set negative if even one bit in the row is to be read more than once. That condition suggests various tactics for efficient memory management in systems that employ the methods herein. For instance, in scenarios in which there is flexibility in the write address, for storage of a data structure to be read only once, the system may select an address in a row for which the forecasted discard state is positive. In some examples, when a data structure to be read only once fails to fill a row, the discard state of that row may be forecasted negative automatically, so as to avoid underutilization of the row. Further optimization may be achieved (vide infra) by storing data that is expected to be read sequentially (e.g., neighboring pixels in an input image) in a single row, and then using a burst read compatible to the length of the row in order to read the entire row. This is a benefit because, when the discard state of a row is positive, reading even a single bit of the row will result in 'deletion' of the entire row. Therefore, data to be read only once should be stored so that it is read in a single burst compatible to the row's size.

At 478C the instruction decoder receives the write instruction, which, as noted hereinabove, may be parsed from compiled program code or dispatched from a command interpreter At 478D the row writer writes the data to the computer memory. In some examples the data may be written based at least in part on the forecasted discard state—e.g., the row to which the data is written may depend on the forecasted discard state. More particularly, the data may be written to a row reserved for data to be read only once if the discard state is forecasted positive, or, to a row reserved for data to be read more than once if the discard state is forecasted negative. This feature directly supports the power-savings advantages herein.

In other examples, the forecasted discard state may be used to control the labeling of individual rows of the computer memory as rows to be read only once or as rows to be read more than once. Accordingly, the operating system may store an appropriate label in a table or other data structure that contains an entry for every occupied row of the memory. In this manner, the row to which the data is written may be dynamically labeled based on the forecasted discard state. In examples in which the written data corresponds to a layer of a neural network, the discard state may be forecast negative when the layer is an output layer and forecast positive when the layer is an input layer or an intermediate layer. The discard state may be forecast negative also when the data corresponds to a weighting coefficient of the neural network. As described above, the result of the forecasting may be manifest in the manner in which the data is written—e.g., the memory partition or label of the rows that contain the data. In some examples, a compiler may automatically forecast positive the discard state of input and/or intermediate layers of a neural network, to support read-and-forget operation in a manner agnostic to the developer.

In some examples, the data is written in an organized state that further improves the power-savings and memory-utilization efficiency of method 476. For instance, the data may be written in a manner that reduces the number of rows of the computer memory that combine data of a positive forecasted discard state and data of a negative forecasted discard state. In these and other examples, data to be read sequentially may be stored in the same row, and each row having a positive discard state may be read using a burst size compatible with a size of the row.

Despite the benefits of forecasting the discard state of stored data prior to writing, that aspect is not necessary in every implementation. In one variant of method 476, the discard state may be determined after the data is read, based at least in part on the content of the data. Consider an example in which a program reads an entire row of data at once but processes only those rows that have a qualifying feature (or do not have a disqualifying feature). If the disqualified rows are never to be processed by the program, then it may be unnecessary to restore them to the memory. Thus, the discard state may be determined by program logic after the read event, irrespective of any row label or of the memory block to which the data was stored. The memory-control logic may enact a read-and-forget operation on rows for which the discard state is positive.

No aspect of the foregoing drawings or description should be interpreted in a limiting sense, because numerous variations, extensions, and omissions are also envisaged. For instance, in state-of-the-art DRAM the row is the unit of memory cells that are read and written-to all at once. Accordingly, the discard state is a row property for DRAM implementations. In other types of read-destructive computer memory, groupings larger or smaller than the row may control the granularity of the discard-state determination.

As noted above, some aspects of the foregoing method may be orchestrated by a compiler, debugger and/or command interpreter, which may packaged in an IDE residing on a developer computer, such as developer computer 104B of FIG. 1. Alternatively or in addition, some of the aspects may correspond to instructions executed by an API or class library 182 attached to executable code 116 running on end-use computer 104C. In these examples, compiler 110 may link the class library to the executable code.

The manner of configuring a developer computer to facilitate the methods herein is not particularly limited. In the example shown in FIG. 1, instructions associated with the foregoing methods are included in IDE software 108, held in computer memory 134A of server computer 104A. The server computer comprises a network interface 184 coupled operatively to the computer memory and configured to distribute the instructions over any suitable network, such as the Internet. In some examples, the instructions may be distributed in a compressed data format. In other examples, the IDE software 108 or other method instructions may be distributed on data-storage media, such as an optical disk or flash drive.

More generally, the methods herein may be tied to a computer system of one or more computing devices. Such methods and processes may be implemented as an application program or service, an application programming interface (API), a library, and/or other computer-program product.

Figure 5:
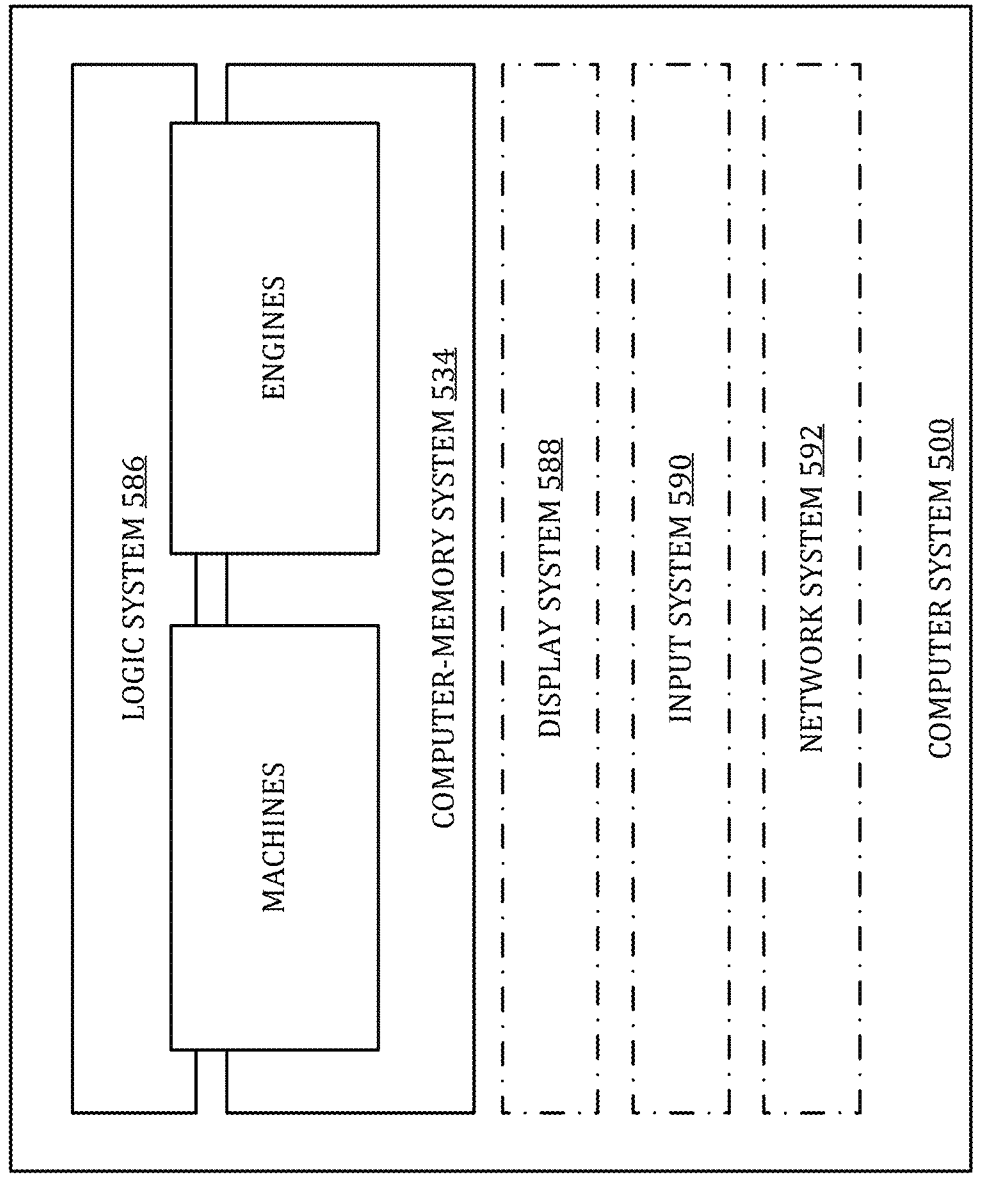
FIG. 5 shows aspects of an example computer system.

FIG. 5 provides a schematic representation of a computer system 502 configured to provide some or all of the computer system functionality disclosed herein. Computer system 502 may take the form of a personal computer, application-server computer, or any other computing device.

Computer system 502 includes a logic system 586 and a computer-memory system 534. Computer system 502 may optionally include a display system 588, an input system 590, a network system 592, and/or other systems not shown in the drawings.

Logic system 586 includes one or more physical devices configured to execute instructions. For example, the logic system may be configured to execute instructions that are part of at least one operating system (OS), application, service, and/or other program construct. The logic system may include at least one hardware processor (e.g., microprocessor, central processor, central processing unit (CPU) and/or graphics processing unit (GPU)) configured to execute software instructions. Additionally or alternatively, the logic system may include at least one hardware or firmware device configured to execute hardware or firmware instructions. A processor of the logic system may be single-core or multi-core, and the instructions executed thereon may be configured for sequential, parallel, and/or distributed processing. Individual components of the logic system optionally may be distributed among two or more separate devices, which may be remotely located and/or configured for coordinated processing. Aspects of the logic system may be virtualized and executed by remotely-accessible, networked computing devices configured in a cloud-computing configuration.

Computer-memory system 588 includes at least one physical device configured to temporarily and/or permanently hold computer system information, such as data and instructions executable by logic system 586. When the computer-memory system includes two or more devices, the devices may be collocated or remotely located. Computer-memory system 588 may include at least one volatile, nonvolatile, dynamic, static, read/write, read-only, random-access, sequential-access, location-read addressable, file-read addressable, and/or content-read addressable computer-memory device. Computer-memory system 588 may include at least one removable and/or built-in computer-memory device. When the logic system executes instructions, the state of computer-memory system 588 may be transformed—e.g., to hold different data.

Aspects of logic system 586 and computer-memory system 588 may be integrated together into one or more hardware-logic components. Any such hardware-logic component may include at least one program- or application-specific integrated circuit (PASIC/ASIC), program- or application-specific standard product (PSSP/ASSP), system-on-a-chip (SOC), or complex programmable logic device (CPLD), for example.

Logic system 586 and computer-memory system 588 may cooperate to instantiate one or more logic machines or engines. As used herein, the terms 'machine' and 'engine' each refer collectively to a combination of cooperating hardware, firmware, software, instructions, and/or any other components that provide computer system functionality. In other words, machines and engines are never abstract ideas and always have a tangible form. A machine or engine may be instantiated by a single computing device, or a machine or engine may include two or more subcomponents instantiated by two or more different computing devices. In some implementations, a machine or engine includes a local component (e.g., a software application executed by a computer system processor) cooperating with a remote component (e.g., a cloud computing service provided by a network of one or more server computer systems). The software and/or other instructions that give a particular machine or engine its functionality may optionally be saved as one or more unexecuted modules on one or more computer-memory devices.

Machines and engines (as used throughout the above description) may be implemented using any suitable combination of machine learning (ML) and artificial intelligence (AI) techniques. Non-limiting examples of techniques that may be incorporated in an implementation of one or more machines include support vector machines, multi-layer neural networks, convolutional neural networks (e.g., spatial convolutional networks for processing images and/or video, and/or any other suitable convolutional neural network configured to convolve and pool features across one or more temporal and/or spatial dimensions), recurrent neural networks (e.g., long short-term memory networks), associative memories (e.g., lookup tables, hash tables, bloom filters, neural Turing machines and/or neural random-access memory) unsupervised spatial and/or clustering methods (e.g., nearest neighbor algorithms, topological data analysis, and/or k-means clustering), and/or graphical models (e.g., (hidden) Markov models, Markov random fields, (hidden) conditional random fields, and/or AI knowledge bases)).

When included, display system 588 may be used to present a visual representation of data held by computer-memory system 588. The visual representation may take the form of a graphical user interface (GUI) in some examples. The display system may include one or more display devices utilizing virtually any type of technology. In some implementations, display system may include one or more virtual-, augmented-, or mixed reality displays.

When included, input system 590 may comprise or interface with one or more input devices. An input device may include a sensor device or a user input device. Examples of user input devices include a keyboard, mouse, or touch screen.

When included, network system 592 may be configured to communicatively couple computer system 502 with one or more other computer systems. The network system may include wired and/or wireless communication devices compatible with one or more different communication protocols. The network system may be configured for communication via personal-, local- and/or wide-area networks.

In conclusion, one aspect of this disclosure is directed to a method for writeback control for read-destructive computer memory. The method comprises: (a) receiving a read instruction; (b) determining a read address in the computer memory corresponding to the read instruction, the read address referencing a cell within a row of the computer memory; (c) determining a discard state for data stored in the row according to a usage of the data, the discard state being positive for data to be read only once and negative for data to be read more than once; (d) reading the data from the row; (e) writing the data back to the row if the discard state is negative; and (f) returning without writing the data back to the row if the discard state is positive.

In some implementations, the usage of the data is usage in a neural network. In some implementations, the data corresponds to a layer of the neural network. In some implementations, the discard state is negative when the layer is an output layer and positive when the layer is an input layer, an intermediate layer, or an intermediate result within a layer. In some implementations, the discard state is negative when the data corresponds to a weighting coefficient of the neural network. In some implementations, reading and writing the data include asserting one or more strobe lines of the memory-control logic, and wherein the one or more strobe lines are asserted differently depending on the discard state. In some implementations, the discard state is determined based at least in part on the read address. In some implementations, the discard state is determined based at least in part on a dynamically stored row label corresponding to the row. In some implementations, the read address is determined based at least in part on the read instruction. In some implementations, the read address is determined based at least in part on the discard state. In some implementations, the discard state is determined based at least in part on the read instruction. In some implementations, reading and writing the data include asserting one or more strobe lines of the memory-control logic, and wherein the one or more strobe lines are asserted differently depending on the discard state. In some implementations, the method further comprises, prior to receiving the read instruction: (g) receiving a write instruction, wherein the discard state is forecasted based at least in part on the write instruction; and (h) writing the data to the computer memory. In some implementations, writing the data to the computer memory includes writing to a row reserved for data to be read only once if the discard state is forecasted positive and writing to a row reserved for data to be read more than once if the discard state is forecasted negative. In some implementations, a row to which the data is written is labeled based at least in part on the discard state as forecasted. In some implementations, writing the data includes reducing a number of rows of the computer memory that combine data of a positive forecasted discard state and data of a negative forecasted discard state. In some implementations, writing the data includes writing such that data to be read sequentially are stored in a same row, and each row having a positive discard state is read using a burst size compatible with a size of the row.

Another aspect of this disclosure is directed to memory-control logic coupled operatively to read-destructive computer memory, the memory-control logic comprising an instruction decoder, writeback logic, a row reader, and a row writer. The instruction decoder is configured to receive a read instruction and to determine a read address in the computer memory corresponding to the read instruction, the read address referencing a cell within a row of the computer memory. The writeback logic is configured to determine a discard state for data stored in the row according to a usage of the data, the discard state being positive for data to be read only once and negative for data to be read more than once. The row reader is configured to read the data from the row, and the row writer is configured to write the data back to the row if the discard state is negative, and to return without writing the data back to the row if the discard state is positive.

In some implementations, the computer memory comprises dynamic random-access memory, DRAM. In some implementations, the computer memory is arranged in a neural-processing unit, NPU.

This disclosure is presented by way of example and with reference to the attached drawing figures. Components, process steps, and other elements that may be substantially the same in one or more of the figures are identified coordinately and described with minimal repetition. It will be noted, however, that elements identified coordinately may also differ to some degree. It will be further noted that the figures are schematic and generally not drawn to scale. Rather, the various drawing scales, aspect ratios, and numbers of components shown in the figures may be purposely distorted to make certain features or relationships easier to see.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. Enacted in memory-control logic of a computer configured for neural-network processing and coupled operatively to read-destructive computer memory, a method comprising:

receiving a read instruction;

determining a read address in the computer memory corresponding to the read instruction, the read address referencing a cell within a row of the computer memory;

determining a discard state for data stored in the row according to a usage of the data in a neural network, the discard state being positive for data to be read only once and negative for data to be read more than once, wherein the discard state is determined based at least in part on a dynamically stored row label corresponding to the row;

reading the data from the row;

writing the data back to the row if the discard state is negative; and returning without writing the data back to the row if the discard state is positive.

2. The method of claim 1 wherein the data corresponds to a layer of the neural network.

3. The method of claim 2 wherein the discard state is negative when the layer is an output layer and positive when the layer is an input layer or an intermediate layer.

4. The method of claim 1 wherein the discard state is negative when the data corresponds to a weighting coefficient of the neural network.

5. The method of claim 1 wherein reading and writing the data include asserting one or more strobe lines of the memory-control logic, and wherein the one or more strobe lines are asserted differently depending on the discard state.

6. The method of claim 1 wherein the discard state is determined based at least in part on the read address.

7. Enacted in memory-control logic coupled operatively to read-destructive computer memory, a method comprising:
- receiving a read instruction;
- determining a read address in the computer memory corresponding to the read instruction, the read address referencing a cell within a row of the computer memory;
- determining a discard state for data stored in the row according to a usage of the data, the discard state being positive for data to be read only once and negative for data to be read more than once, wherein the discard state is determined based at least in part on a dynamically stored row label corresponding to the row;
- reading the data from the row;
- writing the data back to the row if the discard state is negative; and
- returning without writing the data back to the row if the discard state is positive.

8. The method of claim 7 wherein the read address is determined based at least in part on the read instruction.

9. The method of claim 7 wherein the read address is determined based at least in part on the discard state.

10. The method of claim 7 wherein the discard state is determined based at least in part on the read instruction.

11. The method of claim 7 wherein reading and writing the data include asserting one or more strobe lines of the memory-control logic, and wherein the one or more strobe lines are asserted differently depending on the discard state.

12. The method of claim 7 wherein the discard state is determined based at least in part on the read address.

13. The method of claim 7 further comprising, prior to receiving the read instruction:
- receiving a write instruction, wherein the discard state is forecasted based at least in part on the write instruction;
- writing the data to the computer memory.

14. The method of claim 13 wherein writing the data to the computer memory includes writing to a row reserved for data to be read only once if the discard state is forecasted positive and writing to a row reserved for data to be read more than once if the discard state is forecasted negative.

15. The method of claim 13 wherein a row to which the data is written is labeled based at least in part on the discard state as forecasted.

16. Memory-control logic coupled operatively to read-destructive computer memory, the memory-control logic comprising:
- an instruction decoder configured to receive a read instruction and to determine a read address in the computer memory corresponding to the read instruction, the read address referencing a cell within a row of the computer memory;
- writeback logic configured to determine a discard state for data stored in the row according to a usage of the data, the discard state being positive for data to be read only once and negative for data to be read more than once, wherein the discard state is determined based at least in part on a dynamically stored row label corresponding to the row;
- a row reader configured to read the data from the row; and
- a row writer configured to write the data back to the row if the discard state is negative, and to return without writing the data back to the row if the discard state is positive.

17. The memory-control logic of claim 16 wherein the computer memory comprises dynamic random-access memory (DRAM).

18. The memory-control logic of claim 16 wherein the computer memory is arranged in a neural-processing unit (NPU).

* * * * *